United States Patent
Colombo et al.

(10) Patent No.: US 8,198,707 B2
(45) Date of Patent: Jun. 12, 2012

(54) ESTABLISHING A UNIFORMLY THIN DIELECTRIC LAYER ON GRAPHENE IN A SEMICONDUCTOR DEVICE WITHOUT AFFECTING THE PROPERTIES OF GRAPHENE

(75) Inventors: Luigi Colombo, Dallas, TX (US);
Sanjay Banerjee, Austin, TX (US);
Seyoung Kim, Austin, TX (US);
Emanuel Tutuc, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 550 days.

(21) Appl. No.: 12/357,526

(22) Filed: Jan. 22, 2009

(65) Prior Publication Data
US 2010/0181655 A1    Jul. 22, 2010

(51) Int. Cl.
*H01L 29/00*    (2006.01)
*H01L 21/18*    (2006.01)
(52) U.S. Cl. ............ 257/635; 257/415; 257/E21.085; 257/E29.001; 438/591
(58) Field of Classification Search .......... 257/635, 257/E29.001, E21.085, 415; 438/591
See application file for complete search history.

(56) References Cited

U.S. PATENT DOCUMENTS
2010/0330687 A1* 12/2010 Afzali-Ardakani et al. .. 436/149

OTHER PUBLICATIONS
Y. Xuan et al., APL 92, 013101 2008.

* cited by examiner

*Primary Examiner* — Hung Vu
*Assistant Examiner* — Vernon P Webb
(74) *Attorney, Agent, or Firm* — Robert A. Voigt, Jr.; Winstead P.C.

(57) ABSTRACT

A method and semiconductor device for forming a uniformly thin dielectric layer on graphene. A metal or semiconductor layer is deposited on graphene which is located on the surface of a dielectric layer or on the surface of a substrate. The metal or semiconductor layer may act as a nucleation layer for graphene. The metal or semiconductor layer may be subjected to an oxidation process. A thin dielectric layer may then be formed on the graphene layer after the metal or semiconductor layer is oxidized. As a result of synthesizing a metal-oxide layer on graphene, which acts as a nucleation layer for the gate dielectric and buffer to graphene, a uniformly thin dielectric layer may be established on graphene without affecting the underlying characteristics of graphene.

15 Claims, 9 Drawing Sheets

ESTABLISHING A UNIFORMLY THIN DIELECTRIC LAYER ON GRAPHENE IN A SEMICONDUCTOR DEVICE WITHOUT AFFECTING THE PROPERTIES OF GRAPHENE

TECHNICAL FIELD

The present invention relates to semiconductor device fabrication, and more particularly to establishing a uniformly thin dielectric layer on graphene in a semiconductor device without affecting the properties of graphene.

BACKGROUND OF THE INVENTION

A material called graphene has recently been discovered which has the ideal properties believed to make it an excellent component of integrated circuits. Graphene is a one-atom-thick planar sheet of $sp^2$-bonded carbon atoms that are densely packed in a honeycomb crystal lattice. The carbon-carbon bond length in graphene is approximately 1.42 Å. Graphene is the basic structural element of all other graphite materials including graphite, carbon nanotubes and fullerenes.

Graphene has a high carrier mobility as well as low noise thereby allowing it to be utilized as a component in an electronic device. Thin dielectrics, such as gate dielectrics, with a thickness ranging from about one monolayer to about 15 nanometers, are required to form new semiconductor devices using graphene monolayers. Such thin dielectric layers are required to be formed in order to continue the progress towards developing smaller and more efficient semiconductor devices. Researchers are experiencing difficultly in depositing dielectrics, such as a gate dielectric, specifically using atomic layer epitaxy on graphene because of the low sticking coefficient of dielectrics and the hydrophobocity of the grapheme surface. As a result of the low sticking coefficient of dielectrics, thin dielectrics, such as high-k dielectrics, can only be deposited uniformly on graphene when the thickness of the films exceeds several hundred Angstroms. However, such thicknesses are unacceptable in continuing the trend towards developing smaller and more efficient semiconductor devices.

Alternatively, researchers have attempted to functionalize the surface of graphene by treating it with reactive oxygen in order to facilitate the deposition of the thin dielectric on graphene. That is, researchers have attempted to create more nucleation sites on the surface of graphene by treating it with reactive oxygen in order to facilitate the deposition of the thin dielectric on graphene. However, treating the surface of graphene with reactive oxygen can cause severe point defects within the grapheme layer which will eventually give rise to band structure modification and thus carrier scattering. That is, the properties of graphene can be modified such that graphene is no longer a perfect planar sheet of $sp^2$-bonded of carbon which gave rise to the properties believed to make graphene an excellent component of integrated circuits.

As a result, there is a need in the art for establishing a uniformly thin dielectric layer, ranging from a monolayer to about 15 nanometers, on graphene without affecting the ideal properties of graphene.

BRIEF SUMMARY OF THE INVENTION

In one embodiment of the present invention, a semiconductor device comprises a silicon base layer. The semiconductor device further comprises a dielectric layer on the silicon base layer. The semiconductor device additionally comprises a graphene layer on the dielectric layer. Furthermore, the semiconductor device comprises either a metal layer or a semiconductor layer on the graphene layer, where the metal or the semiconductor layer acts as a nucleation layer for the graphene layer.

In another embodiment of the present invention, a semiconductor device comprises a substrate. The semiconductor device further comprises a graphene layer on the substrate. Additionally, the semiconductor device comprises either a metal or a semiconductor layer on the graphene layer, where the metal or the semiconductor layer acts as a nucleation layer for the graphene layer.

In another embodiment of the present invention, a semiconductor device comprises a silicon base layer. The semiconductor device further comprises a dielectric layer on the silicon base layer. Furthermore, the semiconductor device comprises a graphene layer on the dielectric layer. Additionally, the semiconductor device comprises either a metal or a semiconductor layer on the graphene layer, where the metal or semiconductor layer is subjected to an oxidation process thereby forming a dielectric layer on the graphene layer.

In another embodiment of the present invention, a method for forming a uniformly thin dielectric layer on graphene comprises transferring graphene onto a surface of either a dielectric layer or a substrate. Additionally, the method comprises depositing a layer of either metal or semiconductor on the graphene. Further, the method comprises subjecting the layer of metal or semiconductor to an oxidation process. Furthermore, the method comprises depositing a dielectric layer on the oxidized metal or the oxidized semiconductor.

In another embodiment of the present invention, a method for forming a uniformly thin dielectric layer on graphene comprises transferring graphene onto a surface of either a dielectric layer or a substrate. Furthermore, the method comprises depositing a layer of metal or semiconductor on the graphene. Additionally, the method comprises subjecting the layer of metal or semiconductor to an oxidation process. Further, the method comprises introducing a metal precursor after subjecting the layer of metal or semiconductor to the oxidation process. Additionally, the method comprises forming a dielectric layer on the graphene by oxidizing the metal precursor.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE SEVERAL VIEWS OF THE DRAWING

A better understanding of the present invention can be obtained when the following detailed description is considered in conjunction with the following drawings, in which.

DETAILED DESCRIPTION OF THE INVENTION

The present invention comprises a method and semiconductor device for forming a uniformly thin dielectric layer on graphene. In one embodiment of the present invention, a metal or semiconductor layer is deposited on graphene which is transferred to the surface of a dielectric (e.g., silicon dioxide, high-k gate dielectrics) or transferred to the surface of a substrate (e.g., silicon carbide). The metal or semiconductor layer may act as a nucleation layer for graphene thereby allowing a thin dielectric layer to be formed on the graphene after the dielectric layer is deposited on the metal or semiconductor layer. Furthermore, the metal or semiconductor layer may be subjected to an oxidation process. Additionally, the metal or semiconductor layer may be subjected to an ozidizing agent and then subjected to a metal precursor. A dielectric layer may be formed on the graphene after the metal precursor is oxidized. As a result of depositing a metal or semiconductor layer on graphene which acts as a buffer to graphene, a uniformly thin dielectric layer may be established on graphene, as discussed above, without affecting the ideal characteristics of graphene, such as its $sp^2$-bonded carbon atoms.

While the following discusses the present invention in connection with depositing a graphene layer onto a silicon dioxide layer, the principles of the present invention may be applied to depositing a graphene layer that is deposited or synthesized onto other surfaces, such as silicon carbide, sapphire, quartz, glass, etc. Embodiments covering such permutations would fall within the scope of the present invention.

In the following description, numerous specific details are set forth to provide a thorough understanding of the present invention. However, it will be apparent to those skilled in the art that the present invention may be practiced without such specific details.

As discussed in the Background section, researchers have functionalized the surface of graphene by treating it with reactive oxygen in order to facilitate the deposition of the thin dielectric on graphene. That is, researchers have attempted to create more nucleation sites on the surface of graphene by treating it with reactive oxygen in order to facilitate the deposition of the thin dielectric on graphene. However, treating the surface of graphene with reactive oxygen can cause point defect formation within graphene. That is, the properties of graphene are modified such that graphene is no longer a perfect planar sheet of $sp^2$-bonded carbon which has the properties believed to make graphene an excellent component of integrated circuits. Instead, as a result of the modification, graphene can include $sp^3$-bonded carbon atoms or other defects which modify the band structure thus reducing the carrier mobility. As a result, there is a need in the art for establishing a uniformly thin dielectric layer, such as a monolayer or up to about 15 nanometers, on graphene without affecting the ideal properties of graphene, such as its $sp^2$-bonded carbon atoms.

Figure 1:
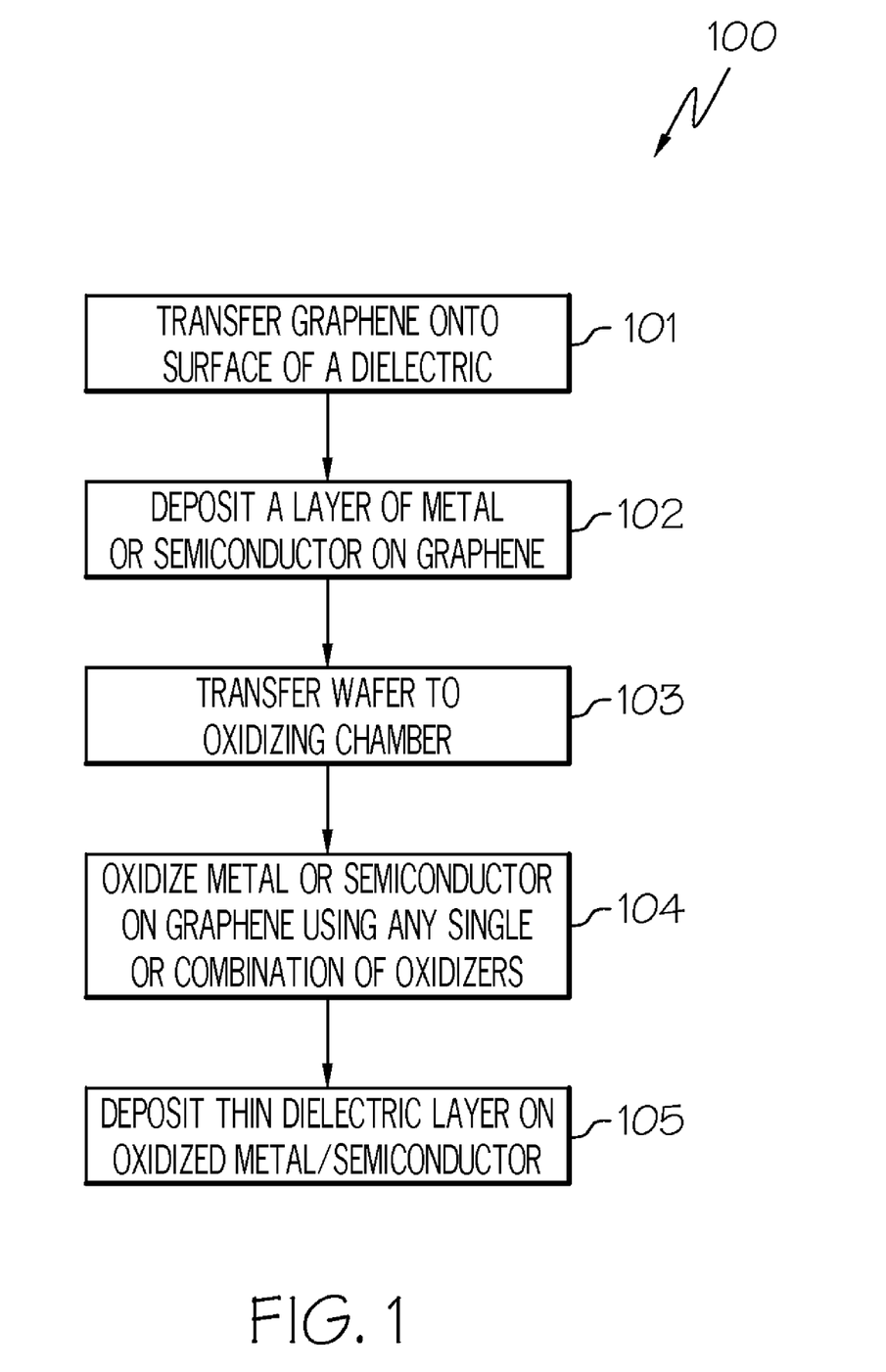
FIG. 1 is a flowchart of a method for forming a uniformly thin dielectric layer on graphene in accordance with an embodiment of the present invention.

A uniformly thin dielectric layer may be established on graphene without affecting the ideal properties of graphene by using the processes described below that incorporate the use of depositing a metal or semiconductor layer on graphene to act as a nucleation layer for the gate dielectric and can also act as a buffer thereby protecting graphene from losing its ideal properties. These processes are described below in connection with FIGS. 1, 2A-D, 3, 4A-D, 5 and 6A-E. FIG. 1 is a flowchart of one embodiment of a method for forming a uniformly thin dielectric layer on graphene. FIGS. 2A-D depict cross-sectional views of the semiconductor device during the fabrication steps described in FIG. 1. FIG. 3 is a flowchart of a second embodiment of a method for forming a uniformly thin dielectric layer on graphene synthesized on silicon carbide. FIGS. 4A-D depict cross-sectional views of the semiconductor device during the fabrication steps described in FIG. 3. FIG. 5 is a flowchart of a third embodiment of a method for forming a uniformly thin dielectric layer on graphene. FIGS. 6A-E depict cross-sectional views of the semiconductor device during the fabrication steps described in FIG. 5.

FIG. 1—Method for Forming a Uniformly Thin Dielectric Layer on Graphene

FIG. 1 is a flowchart of a method 100 for forming a uniformly thin dielectric layer on graphene in accordance with an embodiment of the present invention. FIG. 1 will be discussed in conjunction with FIGS. 2A-D, which depict cross-sectional views of semiconductor device 200 during the fabrication steps described in FIG. 1 in accordance with an embodiment of the present invention.

Figure 2A:
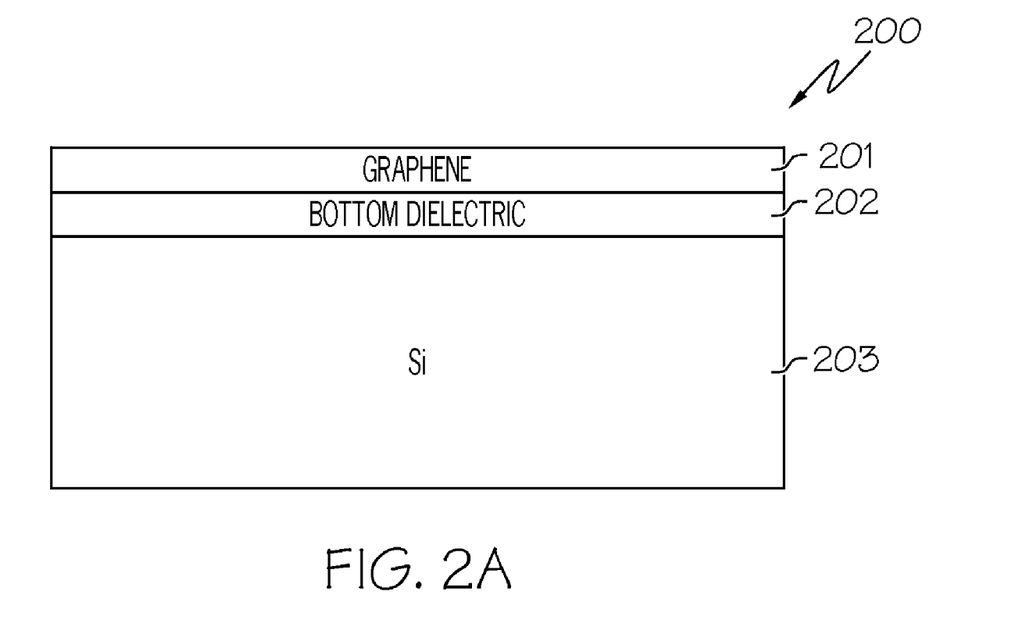
FIGS. 2A-D depict cross-sectional views of a semiconductor device during the fabrication of the steps described in FIG. 1 in accordance with an embodiment of the present invention.

Referring to FIG. 1, in conjunction with FIGS. 2A-D, in step 101, a layer of graphene 201 is transferred from a source of origin onto a surface of a bottom dielectric 202 (e.g., silicon dioxide ($SiO_2$), high-k dielectric) which resides on a silicon base layer 203 as illustrated in FIG. 2A. While FIGS. 2A-D depict graphene layer 201 being transferred onto bottom dielectric 202, the principles of the present invention include transferring graphene layer 201 onto other surfaces. All example of transferring graphene layer 201 onto a surface includes mechanical exfoliation on $SiO_2$/Si.

Figure 2B:
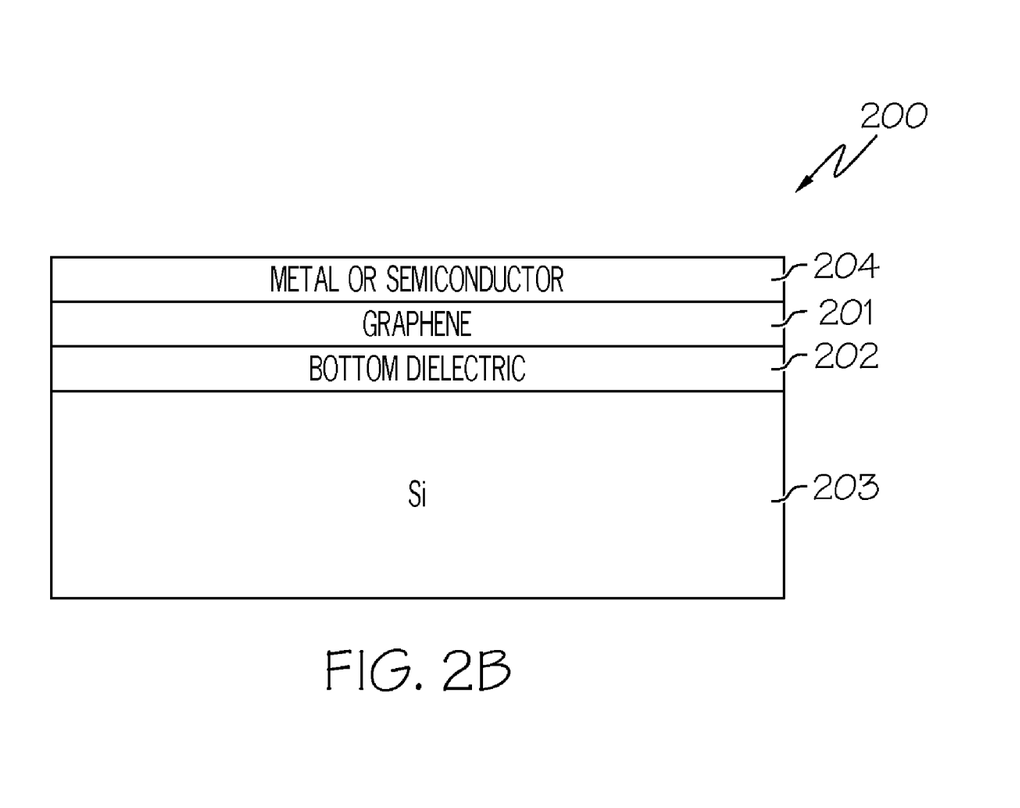
Figure 3:
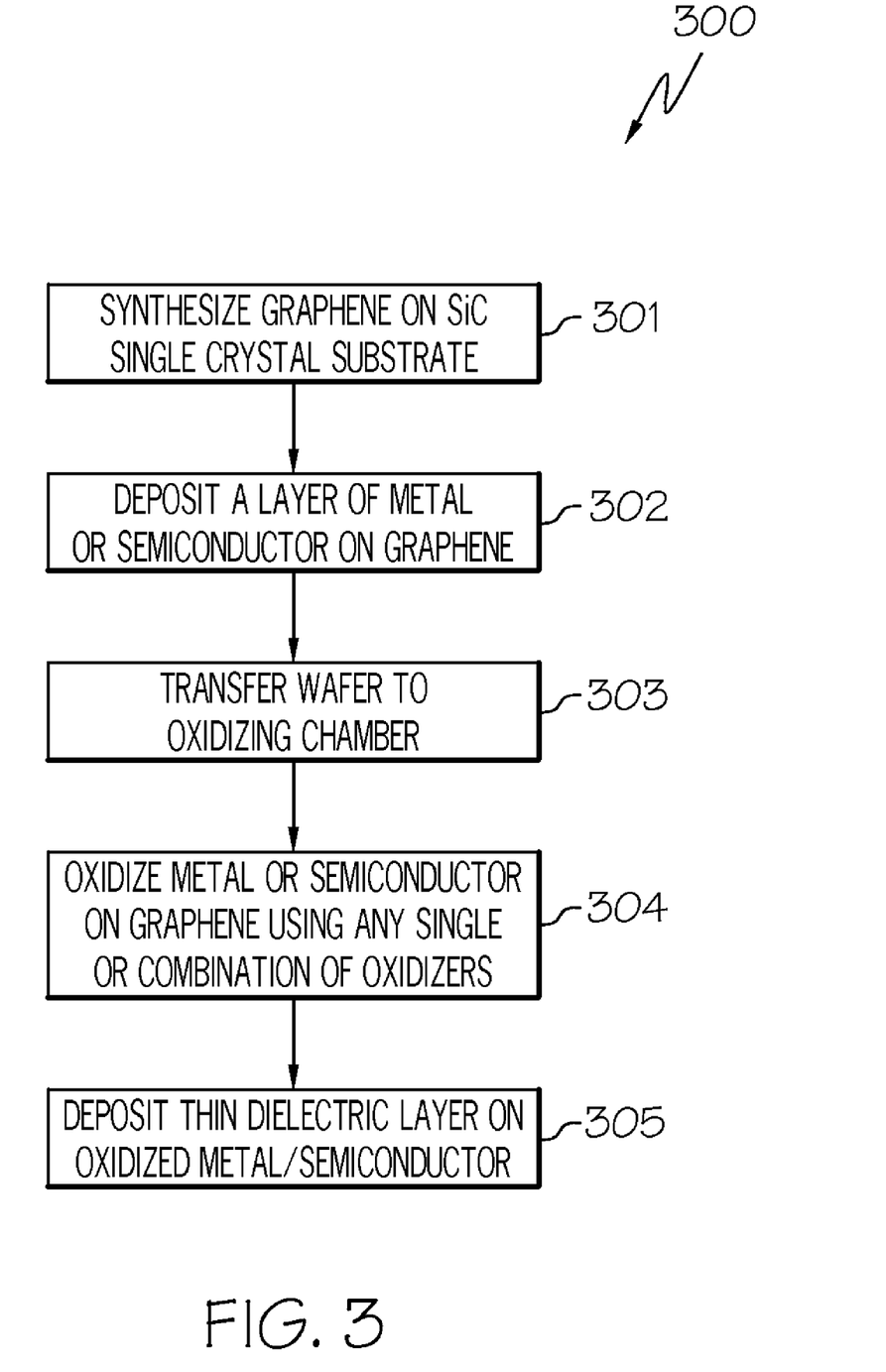
FIG. 3 is an alternative method for forming a uniformly thin dielectric layer on graphene in accordance with an embodiment of the present invention.

In step 102, a layer of metal or semiconductor 204, such as aluminum, silicon, indium, zinc, cadmium, hafnium, zirconium, tanatalum, niobium, lanthanum, yittrium, titanium, etc., is deposited on graphene layer 201 as illustrated in FIG. 2B. It is noted that other metals or semiconductors may be deposited onto graphene layer 201 in addition to the ones listed above. The principles of the present invention are to include the deposition of any metal or semiconductor layer that protects the properties of graphene layer 201. In one embodiment, metal or semiconductor layer 204 is deposited onto graphene layer 201 via physical vapor deposition. Variants of physical vapor deposition include, without limitation, electron beam physical vapor deposition, sputter deposition, cathodic arc deposition, and pulsed laser deposition or any other deposition technique that is surface insensitive (i.e., mass transport limited) and does not damage the graphene surface. In one embodiment, metal or semiconductor layer 204 is deposited onto graphene layer 201 via chemical vapor deposition. In one embodiment, metal or semiconductor layer 204 has a thickness between a monolayer and 15 nanometers. In one embodiment, metal or semiconductor layer 204 is deposited on graphene layer 201 between 77 K and 800° C.

Figure 2C:
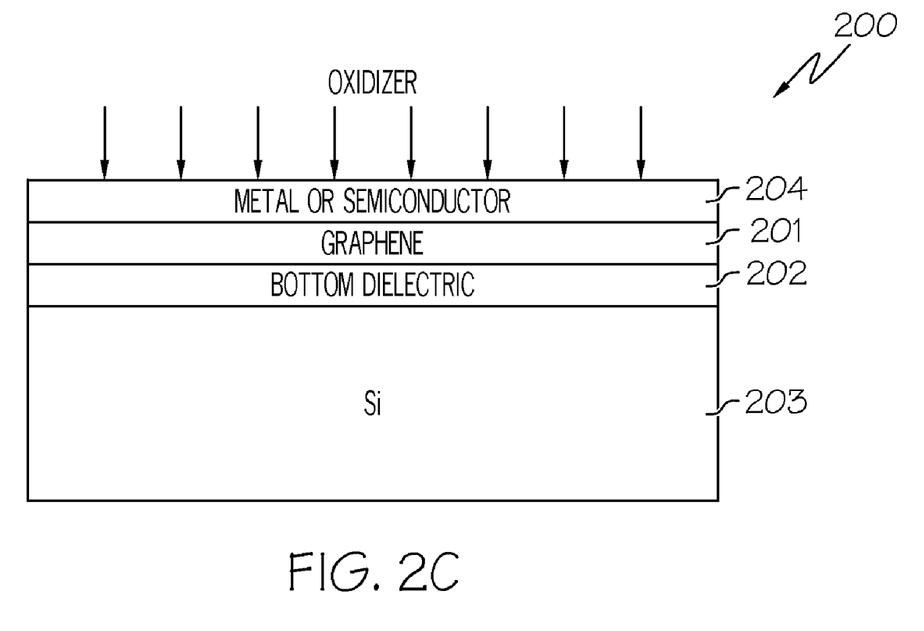

In step 103, the wafer is transferred to an oxidizing chamber. In step 304, the metal or semiconductor layer 204 Is subjected to an oxidation process (e.g., $O_2$, $O_3$, $NO_2$, NO, UV $O_2$, $H_2O+H_2O_2$, and $H_2O+O_3$) as illustrated in FIG. 2C.

Figure 2D:
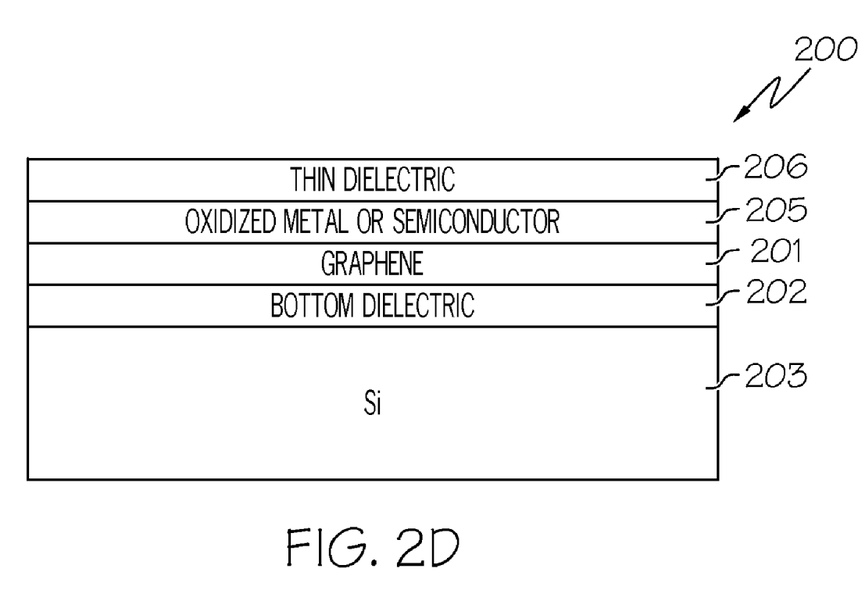

In step 105, a thin dielectric layer 206 (e.g., $Al_2O_3$, $HfO_2$, HfSiO, ZrSiO, LaHfO, LaZrO, LaAlO, HfZrO, HfAlO, LaSiO, AlSiO or oxynitrides of the aforementioned dielectrics) is deposited onto oxidized metal or semiconductor layer 205 which acts as a nucleation layer on graphene 201 as illustrated in FIG. 2D. In one embodiment, thin dielectric layer 206 is deposited using atomic layer deposition. In another embodiment, thin dielectric layer 206 is deposited using chemical vapor deposition or physical vapor deposition. In one embodiment, the thickness of dielectric layer 206 may range from a monolayer to a thickness (e.g., 100 nanometers) required for the fabrication of the device.

By first depositing metal or semiconductor layer 204 onto graphene 201, a uniformly thin dielectric layer 206, such as $Al_2O_3$, is capable of being deposited onto graphene 201. The presence of oxidized metal or semiconductor 205 allows a large number of nuclei across the surface of graphene 201 thereby ensuring a uniform deposition of dielectric layer 206. The presence of metal or semiconductor 204 has the added benefit of using a less reactive element on the bare surface of graphene 201 in comparison to other potential very reactive elements, such as reactive oxygen, thereby ensuring that the properties of graphene 201 (e.g., $sp^2$-bonded carbon atoms) remain undisturbed.

Method 100 may include other and/or additional steps that, for clarity, are not depicted. Further, method 100 may be executed in a different order presented and that the order presented in the discussion of FIG. 1 is illustrative. Additionally, certain steps in method 100 may be executed in a substantially simultaneous manner or may be omitted.

Another embodiment of a method for forming a uniformly thin dielectric layer is discussed below in connection with FIGS. 3 and 4A-D.

FIG. 3—Alternative Method for Forming a Uniformly Thin Dielectric Layer on Graphene FIG. 3 is a flowchart of an alternative method 300 for forming a uniformly thin dielectric layer on graphene in accordance with an embodiment of the present invention. FIG. 3 will be discussed in conjunction with FIGS. 4A-D, which depict cross-sectional views of semiconductor device 400 during the fabrication steps described in FIG. 3 in accordance with an embodiment of the present invention.

Figure 4A:
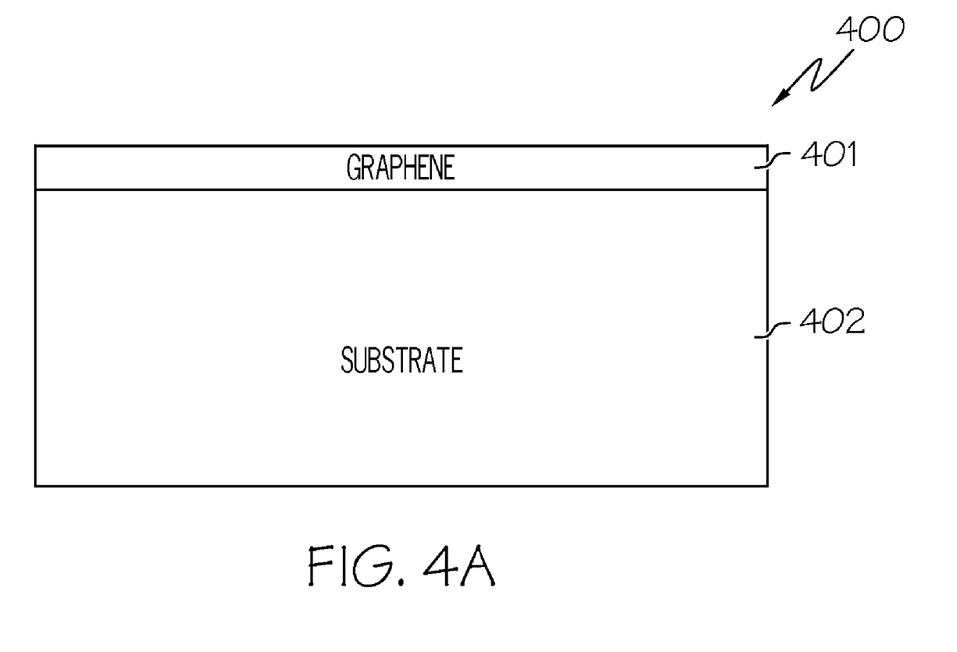
FIGS. 4A-D depict cross-sectional views of a semiconductor device during the fabrication of the steps described in FIG. 3 in accordance with an embodiment of the present invention.

Referring to FIG. 3, in conjunction with FIGS. 4A-D, in step 301, a layer of graphene 401 is transferred from a source of origin onto a surface of a substrate 402 (e.g., silicon carbide, germanium, sapphire, gallium arsenide, combination of one or more elements from groups III and V, or any other suitable substrate) as illustrated in FIG. 4A. While FIGS. 4A-D depict graphene layer 401 being transferred onto substrate 402, the principles of the present invention include transferring graphene layer 401 onto other surfaces. An example of transferring graphene layer 401 onto a substrate includes thermal graphitization of a silicon carbide surface.

Figure 4B:
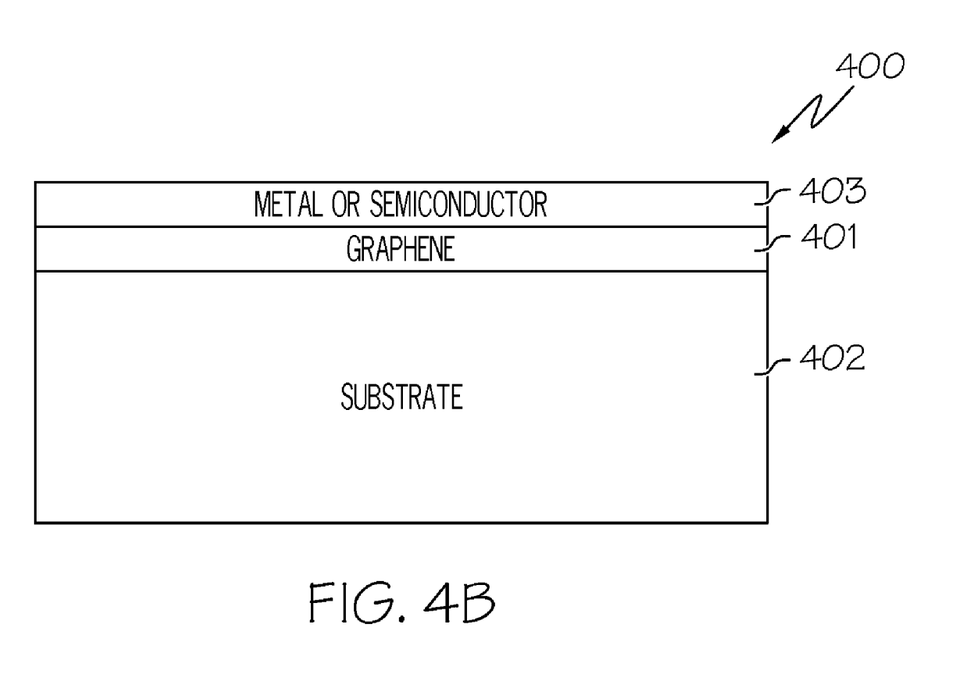
Figure 5:
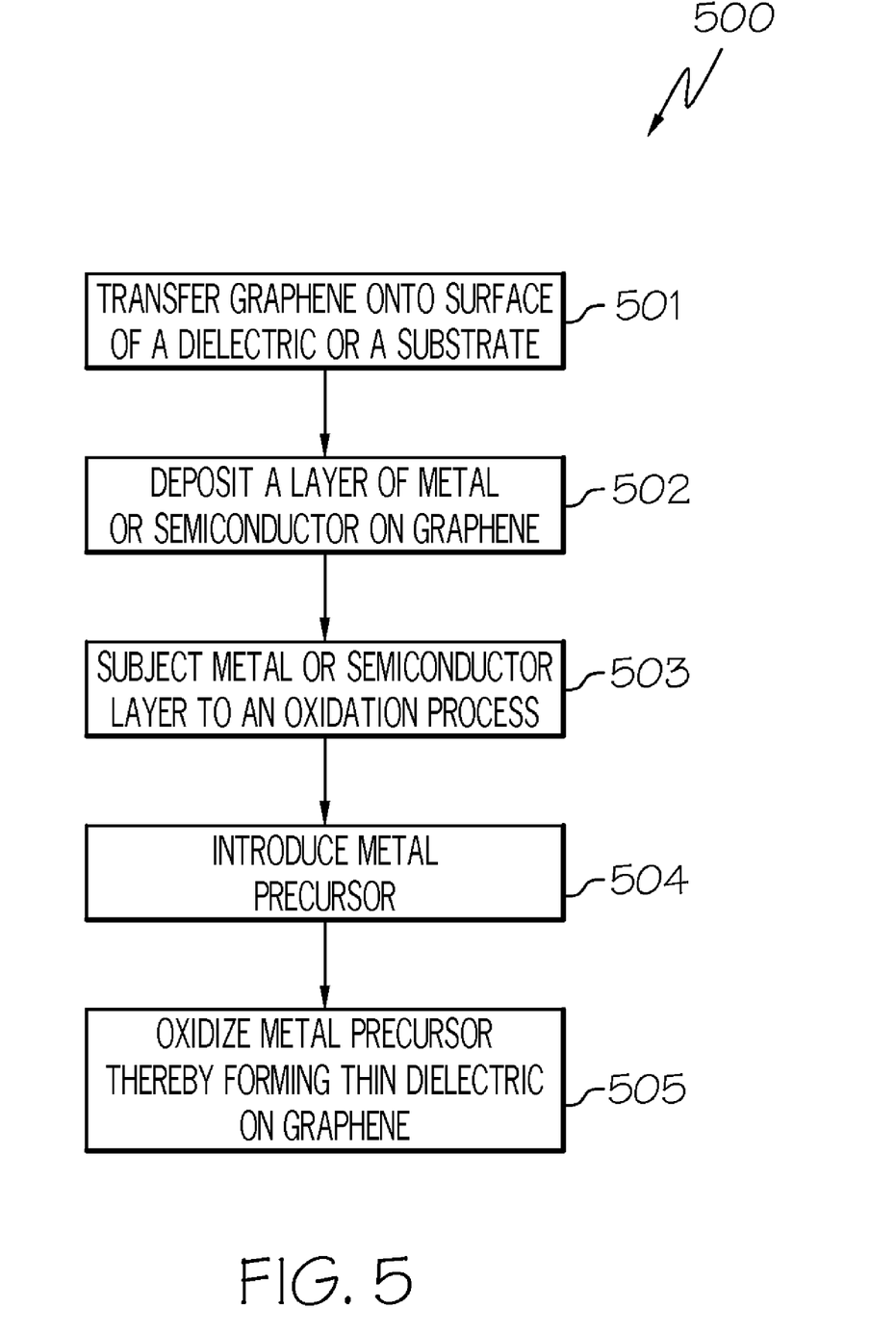
FIG. 5 is another alternative method for forming a uniformly thin dielectric layer on graphene in accordance with an embodiment of the present invention.

In step 302, a layer of metal or semiconductor 403, such as aluminum, silicon, indium, zinc, cadmium, hafnium, zirconium, tanatalum, niobium, lanthanum, yittrium, and titanium, is deposited on graphene layer 401 as illustrated in FIG. 4B. It is noted that other metals or semiconductors may be deposited onto graphene layer 401 in addition to the ones listed above. The principles of the present invention are to include the deposition of any metal or semiconductor layer that protects the properties of graphene layer 401. In one embodiment, metal or semiconductor layer 403 is deposited onto graphene layer 401 via physical vapor deposition. Variants of physical vapor deposition include, without limitation, electron beam physical vapor deposition, sputter deposition, cathodic arc deposition, and pulsed laser deposition or any other deposition technique that is surface insensitive (i.e., mass transport limited). In one embodiment, metal or semiconductor layer 204 is deposited onto graphene layer 201 via chemical vapor deposition. In one embodiment, metal or semiconductor layer 403 has a thickness between a monolayer and 15 nanometers. In one embodiment, metal or semiconductor layer 403 is deposited on graphene layer 401 between 77 K and 800° C.

Figure 4C:
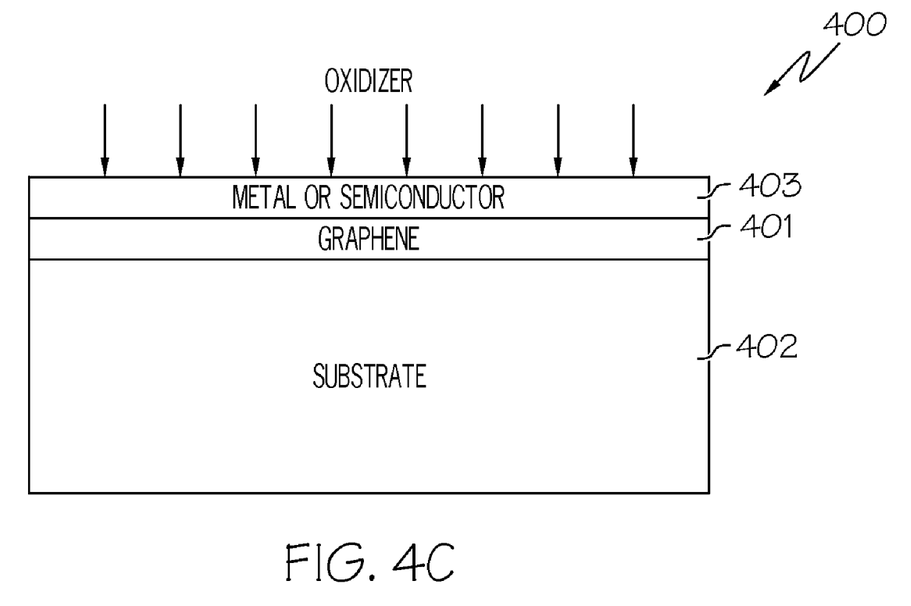

In step 303, the wafer is transferred to an oxidizing chamber. In step 304, the metal or semiconductor layer 403 is subjected to an oxidation process (e.g., $O_2$, $O_3$, $NO_2$, NO, UV $O_2$, $H_2O+H_2O_2$, and $H_2O+O_3$ or any combination of these oxidizers) as illustrated in FIG. 4C.

Figure 4D:
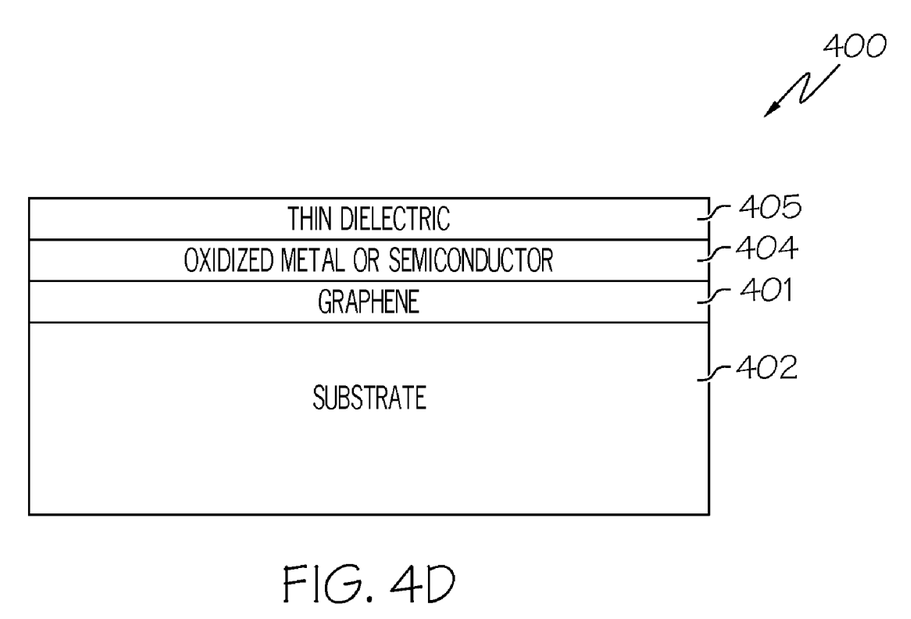

In step 305, a thin dielectric layer 405 (e.g., $Al_2O_3$, $HfO_2$, HfSiO, ZrSiO, LaHfO, LaZrO, LaAlO, HfZrO, HfAlO, LaSiO, AlSiO and oxynitrides of these dielectrics) is deposited onto oxidized metal or semiconductor layer 404 which acts as a nucleation layer on graphene 401 as illustrated in FIG. 4D. In one embodiment, thin dielectric layer 405 is deposited using atomic layer deposition. In another embodiment, thin dielectric layer 405 is deposited using chemical vapor deposition or physical vapor deposition. In one embodiment, the thickness of dielectric layer 405 may range from a monolayer to a thickness (e.g., 100 nanometers) required for the fabrication of the device.

By first depositing metal or semiconductor layer 403 onto graphene 401, a uniformly thin dielectric layer 405, such as $Al_2O_3$, is capable of being deposited onto graphene 401. The presence of oxidized metal or semiconductor 404 allows a large number of nuclei across the surface of graphene 401 thereby ensuring a uniform deposition of dielectric layer 405. The presence of metal or semiconductor 403 has the added benefit of using a less reactive element on the bare surface of graphene 401 in comparison to other potential very reactive elements, such as reactive oxygen, thereby ensuring that the properties of graphene 201 remain undisturbed.

Method 300 may include other and/or additional steps that, for clarity, are not depicted. Further, method 300 may be executed in a different order presented and that the order presented in the discussion of FIG. 3 is illustrative. Additionally, certain steps in method 300 may be executed in a substantially simultaneous manner or may be omitted.

Another embodiment of a method for forming a uniformly thin dielectric layer on graphene is discussed below in connection with FIGS. 5 and 6A-E.

FIG. 5—Another Alternative Method for Forming a Uniformly Thin Dielectric Layer on Graphene FIG. 5 is a flowchart of an alternative method 500 for forming a uniformly thin dielectric layer on graphene in accordance with an embodiment of the present invention. FIG. 5 will be discussed in conjunction with FIGS. 6A-E, which depict cross-sectional views of semiconductor device 600 during the fabrication steps described in FIG. 5 in accordance with an embodiment of the present invention.

Figure 6A:
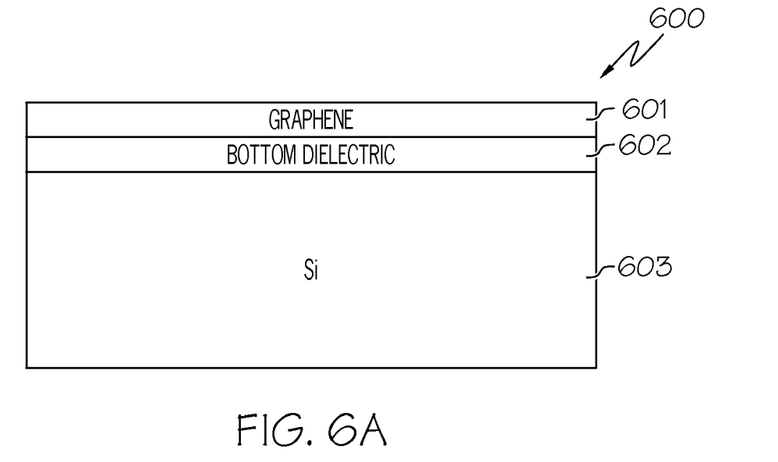
FIGS. 6A-E depict cross-sectional views of a semiconductor device during the fabrication of the steps described in FIG. 5 in accordance with an embodiment of the present invention.

Referring to FIG. 5, in conjunction with FIGS. 6A-E, in step 501, a layer of graphene 601 is transferred from a source of origin onto a surface of a dielectric layer 602 (e.g., silicon dioxide, high-k dielectric) which resides on a silicon base layer 603 as illustrated in FIG. 6A or transferred onto a surface of a substrate (e.g., silicon carbide) (not shown). While FIGS. 6A-E depict graphene layer 601 being transferred onto bottom dielectric layer 602, the principles of the present invention include transferring graphene layer 601 onto other surfaces, such as a substrate (e.g., silicon carbide substrate, substrate comprised of a combination of one or more elements from groups III and V). An example of transferring graphene layer 601 onto a surface includes mechanical exfoliation on $SiO_2$/Si or thermal graphitization of a SiC surface.

Figure 6B:
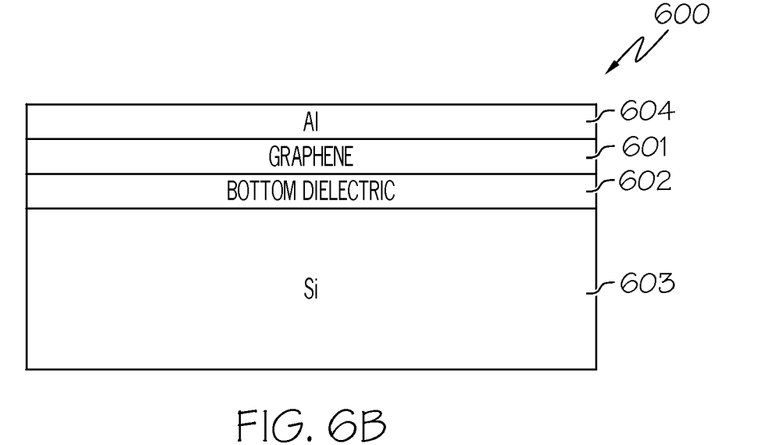

In step 502, a layer of metal or semiconductor 604, such as aluminum, silicon, indium, zinc, cadmium, hafnium, zirconium, tanatalum, niobium, lanthanum, yittrium, and titanium, is deposited on graphene layer 601 as illustrated in FIG. 6B. While FIG. 6B depicts a layer of aluminum being deposited onto graphene layer 601, it is noted that other metals or semiconductors may be deposited onto graphene layer 601 including the ones listed above. The principles of the present invention are to include the deposition of any metal or semiconductor layer that protects the properties of graphene layer 601. In one embodiment, metal or semiconductor layer 604 is deposited onto graphene layer 601 via physical vapor deposition. Variants of physical vapor deposition include, without limitation, electron beam physical vapor deposition, sputter deposition, cathodic arc deposition, and pulsed laser deposition. In one embodiment, metal or semiconductor layer 204 is deposited onto graphene layer 201 via chemical vapor deposition. In one embodiment, metal or semiconductor layer 604 has a thickness between a monolayer and 15 nanometers. In one embodiment, metal or semiconductor layer 604 is deposited on graphene layer 601 between 77 K and 800° C.

Figure 6C:
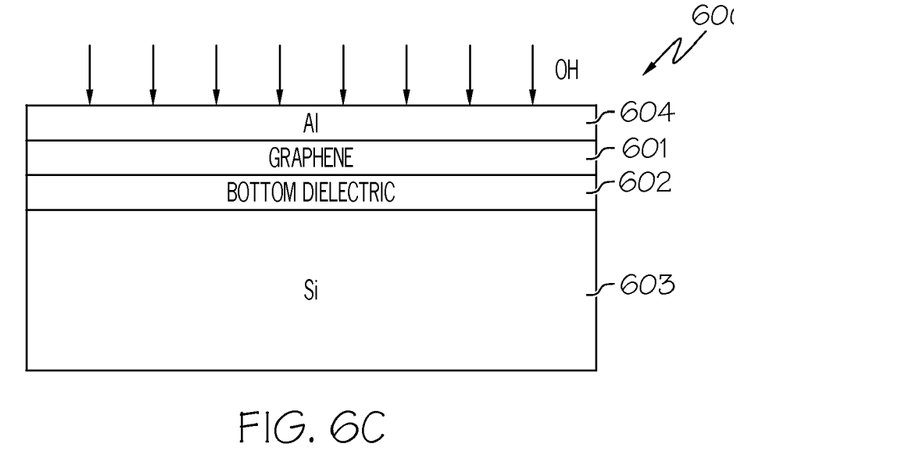

In step 503, metal or semiconductor layer 604 is subjected to an oxidation process involving an oxidizing agent, such as OH, as illustrated in FIG. 6C. Metal or semiconductor layer 604 may be oxidized using various elements, such as $O_2$, $O_3$, $N_2O$, NO, UV $O_2$, $H_2O+H_2O_2$, and $H_2O+O_3$ or any combination of these oxidizers.

Figure 6D:
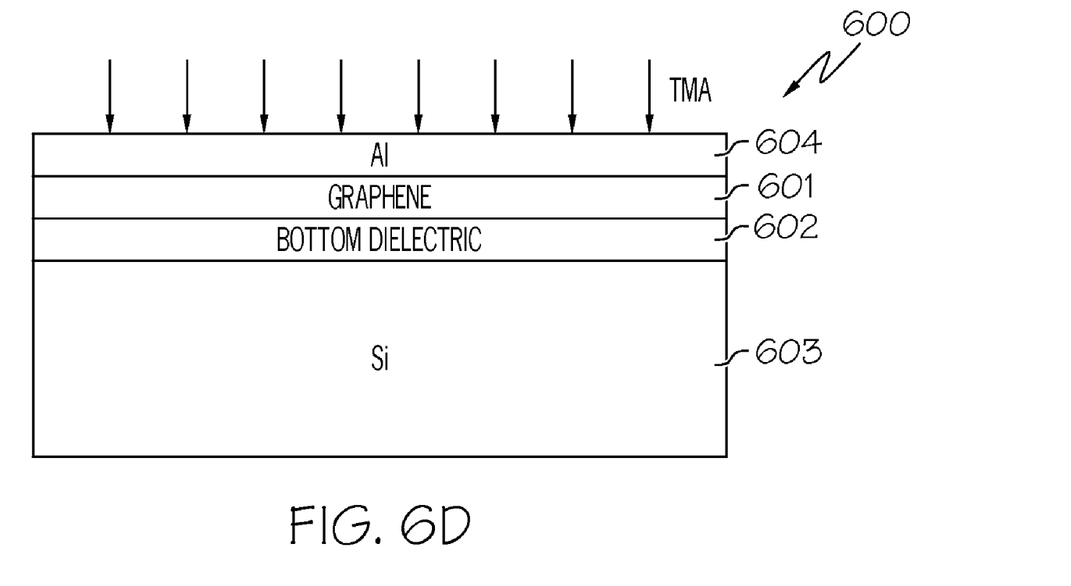
Figure 6E:
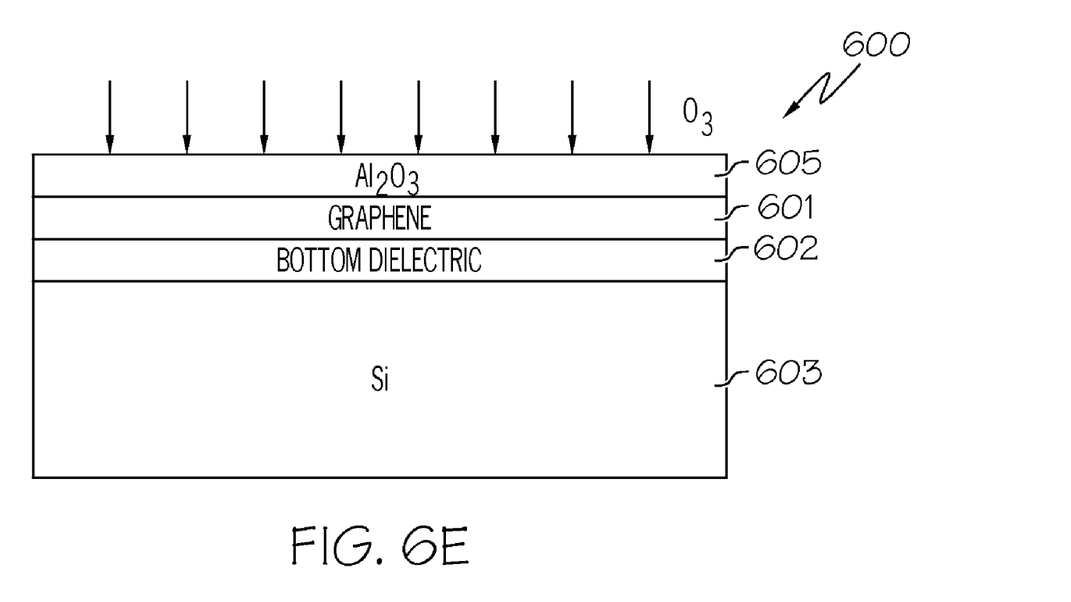

In step 504, metal or semiconductor layer 604 is subjected to a precursor deposition process, such as atomic layer deposition, where the metal or semiconductor surface is exposed first to an oxidizer, e.g., $H_2O$, and then to a precursor, such as trimethyl aluminum (TMA), which attaches to the OH as illustrated in FIG. 6D. In step 505, TMA is oxidized, such as being subjected to ozone ($O_3$) to thereby form the dielectric layer 605, such as $Al_2O_3$, as illustrated in FIG. 6E.

While the foregoing disclosed forming a dielectric layer of $Al_2O_3$, it is noted that other dielectric layers may be formed, such as $HfO_2$ using tetrakisethylmethylamido hafnium (TDMAH), tetrakisdiethylamido hafnium (TDEAH) of Hf-t-butoxide as the precursor instead of TMA, and a silicon precursor, such as tetraethylorthosilicate (TEOS), can also be added to form a silicate.

In one embodiment, the thickness of dielectric layer 605 may range from a monolayer to whatever thickness (e.g., 100 nanometers) is required for the fabrication of the device.

By first depositing metal or semiconductor layer 604 onto graphene 601, a uniformly thin dielectric layer 605, such as $Al_2O_3$, is capable of being formed onto graphene 601. As discussed above, the presence of metal or semiconductor 604 allows a large number of nuclei across the surface of graphene 601 thereby ensuring a uniform dielectric layer 605. As a result of subjecting metal or semiconductor 604 to an oxidation process, a uniformly thin dielectric layer 605 is formed without disturbing the properties or characteristics of graphene 601 (e.g., $sp^2$-bonded carbon atoms).

Method 500 may include other and/or additional steps that, for clarity, are not depicted. Further, method 500 may be executed in a different order presented and that the order presented in the discussion of FIG. 5 is illustrative. Additionally, certain steps in method 500 may be executed in a substantially simultaneous manner or may be omitted.

Although the method and semiconductor device are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims.

The invention claimed is:

1. A method for forming a uniformly thin dielectric layer on graphene, the method comprising:
   transferring graphene onto a surface of one of a first dielectric layer and a substrate;
   depositing a layer of one of a metal and a semiconductor on said graphene;
   subjecting said layer of one of said metal and said semiconductor to an oxidation process; and
   depositing a second dielectric layer on one of said oxidized metal and said oxidized semiconductor.

2. The method as recited in claim 1, wherein one of said metal and said semiconductor layer comprises one of the following: aluminum, silicon, indium, zinc, cadmium, hafnium, zirconium, tanatalum, niobium, lanthanum, yittrium, and titanium.

3. The method as recited in claim 1, wherein one of said metal and said semiconductor layer is deposited on said graphene layer via physical vapor deposition.

4. The method as recited in claim 1, wherein one of said metal and said semiconductor layer is deposited on said graphene layer via chemical vapor deposition.

5. The method as recited in claim 1, wherein one of said metal and said semiconductor layer has a thickness between a monolayer and 15 nanometers.

6. The method as recited in claim 1, wherein one of said metal and said semiconductor layer is deposited on said graphene at a temperature between 77 K and 800° C.

7. The method as recited in claim 1, wherein said substrate comprises one or more elements from groups III and V.

8. The method as recited in claim 1, wherein said second dielectric layer comprises one of the following: $Al_2O_3$, $HfO_2$, HfSiO, ZrSiO, LaHfO, LaZrO, LaAlO, HfZrO, HfAlO, LaSiO, AlSiO, and oxynitrides of the aforementioned compounds.

9. A method for forming a uniformly thin dielectric layer on graphene, the method comprising:
   transferring graphene onto a surface of one of a first dielectric layer and a substrate:
   depositing a layer of one of a metal and a semiconductor on said graphene;
   subjecting said layer of one of said metal and said semiconductor to an oxidation process;
   introducing a metal precursor after subjecting said layer of one of said metal and said semiconductor to said oxidation process; and
   forming a second dielectric layer on said graphene by oxidizing said metal precursor.

10. The method as recited in claim 9, wherein one of said metal and said semiconductor layer is oxidized using one of the following: $O_2$, $O_3$, $NO_2$, NO, UV $O_2$, $H_2O+H_2O_2$, $H_2O+O_3$, and any combination of preceding oxidizers.

11. The method as recited in claim 9, wherein said metal precursor comprises trimethyl aluminum.

12. The method as recited in claim 9, wherein one of said metal and said semiconductor layer comprises one of the following: aluminum, silicon, indium, zinc, cadmium, hafnium, zirconium and titanium.

13. The method as recited in claim 9, wherein one of said metal and said semiconductor layer is deposited on said graphene layer via physical vapor deposition.

14. The method as recited in claim 9, wherein one of said metal and said semiconductor layer has a thickness between a monolayer and 15 nanometers.

15. The method as recited in claim 9, wherein one of said metal and said semiconductor layer is deposited on said graphene at a temperature between 77K and 800° C.

* * * * *